United States Patent
Saito et al.

(10) Patent No.: US 11,398,494 B2
(45) Date of Patent: Jul. 26, 2022

(54) SEMICONDUCTOR STORAGE DEVICE AND METHOD OF MANUFACTURING THE SAME

(71) Applicant: Kioxia Corporation, Tokyo (JP)

(72) Inventors: Yuta Saito, Yokkaichi Mie (JP); Shinji Mori, Nagoya Aichi (JP); Atsushi Takahashi, Yokkaichi Mie (JP); Toshiaki Yanase, Yokkaichi Mie (JP); Keiichi Sawa, Yokkaichi Mie (JP); Kazuhiro Matsuo, Kuwana Mie (JP); Hiroyuki Yamashita, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 133 days.

(21) Appl. No.: 16/809,887

(22) Filed: Mar. 5, 2020

(65) Prior Publication Data

US 2021/0013225 A1    Jan. 14, 2021

(30) Foreign Application Priority Data

Jul. 11, 2019   (JP) .............................. JP2019-128985

(51) Int. Cl.
*H01L 27/11582* (2017.01)
*H01L 21/02* (2006.01)
*H01L 29/04* (2006.01)

(52) U.S. Cl.
CPC .. *H01L 27/11582* (2013.01); *H01L 21/02672* (2013.01); *H01L 29/045* (2013.01)

(58) Field of Classification Search
CPC ......... H01L 27/11582; H01L 21/02672; H01L 29/045; H01L 21/02532; H01L 21/02595;
(Continued)

(56) References Cited

U.S. PATENT DOCUMENTS 6,420,751 B1   7/2002 Maeda
7,547,610 B2   6/2009 Schwan
(Continued)

FOREIGN PATENT DOCUMENTS

JP   H07-307286 A   11/1995
JP   2001-308008 A   11/2001
(Continued)

OTHER PUBLICATIONS

F. Gamiz et al., "Monte-Carlo Simulation of Ultra-Thin Film Silicon-On-Insulator MOSFETs", International Journal of High Speed Electronics and Systems, vol. 22, No. 1, 2013, 1350001-1-135001-32.

(Continued)

*Primary Examiner* — Julia Slutsker
(74) *Attorney, Agent, or Firm* — Foley & Lardner LLP

(57) ABSTRACT

In one embodiment, a semiconductor storage device includes a stacked body in which a plurality of conducting layers are stacked through a plurality of insulating layers in a first direction, a semiconductor layer penetrating the stacked body, extending in the first direction and including metal atoms, and a memory film including a first insulator, a charge storage layer and a second insulator that are provided between the stacked body and the semiconductor layer. The semiconductor layer surrounds a third insulator penetrating the stacked body and extending in the first direction, and at least one crystal grain in the semiconductor layer has a shape surrounding the third insulator.

14 Claims, 16 Drawing Sheets

(58) Field of Classification Search
CPC .......... H01L 21/02609; H01L 21/3221; H01L 27/11556; H01L 21/0262; H01L 27/11568; H01L 27/11573; H01L 27/11575; H01L 27/11578
See application file for complete search history.

(56) References Cited

U.S. PATENT DOCUMENTS

| | | |
|---|---|---|
| 10,438,966 B2 | 10/2019 | Shioda |
| 2018/0240809 A1* | 8/2018 | Ye .................... H01L 21/30604 |
| 2018/0269277 A1 | 9/2018 | Miyagawa et al. |
| 2019/0006386 A1 | 1/2019 | Yamazaki et al. |
| 2019/0080772 A1* | 3/2019 | Yanagidaira ........... G11C 16/32 |
| 2019/0088673 A1* | 3/2019 | Maeda .............. H01L 27/11582 |
| 2019/0371810 A1 | 12/2019 | Saito |

FOREIGN PATENT DOCUMENTS

| | | |
|---|---|---|
| JP | 2003-100629 A | 4/2003 |
| JP | 3403231 B2 | 5/2003 |
| JP | 2010-505269 A | 2/2010 |
| JP | 2019-41054 A | 3/2019 |
| JP | 2019-207973 A | 12/2019 |

OTHER PUBLICATIONS

Portillo et al., "Precession Electron Diffraction assisted Orientation Mapping in the Transmission Electron Microscope", Materials Science Forum vol. 644 (2010) pp. 1-7.

* cited by examiner

SEMICONDUCTOR STORAGE DEVICE AND METHOD OF MANUFACTURING THE SAME

CROSS REFERENCE TO RELATED APPLICATION

This application is based upon and claims the benefit of priority from the prior Japanese Patent Application No. 2019-128985, filed on Jul. 11, 2019, the entire contents of which are incorporated herein by reference.

FIELD

Embodiments described herein relate to a semiconductor storage device and a method of manufacturing the same.

BACKGROUND

Characteristics of a channel semiconductor layer in a semiconductor memory largely affect performance of a memory cell. For example, a low mobility in the channel semiconductor layer causes a high threshold voltage of the memory cell, which results in a high operation voltage of the memory cell.

DETAILED DESCRIPTION

In one embodiment, a semiconductor storage device includes a stacked body in which a plurality of conducting layers are stacked through a plurality of insulating layers in a first direction, a semiconductor layer penetrating the stacked body, extending in the first direction and including metal atoms, and a memory film including a first insulator, a charge storage layer and a second insulator that are provided between the stacked body and the semiconductor layer. The semiconductor layer surrounds a third insulator penetrating the stacked body and extending in the first direction, and at least one crystal grain in the semiconductor layer has a shape surrounding the third insulator.

Embodiments will now be explained with reference to the accompanying drawings. The same or similar configurations in FIGS. 1 to 18B are given the same signs and their duplicate description is omitted.

First Embodiment

Figure 1:
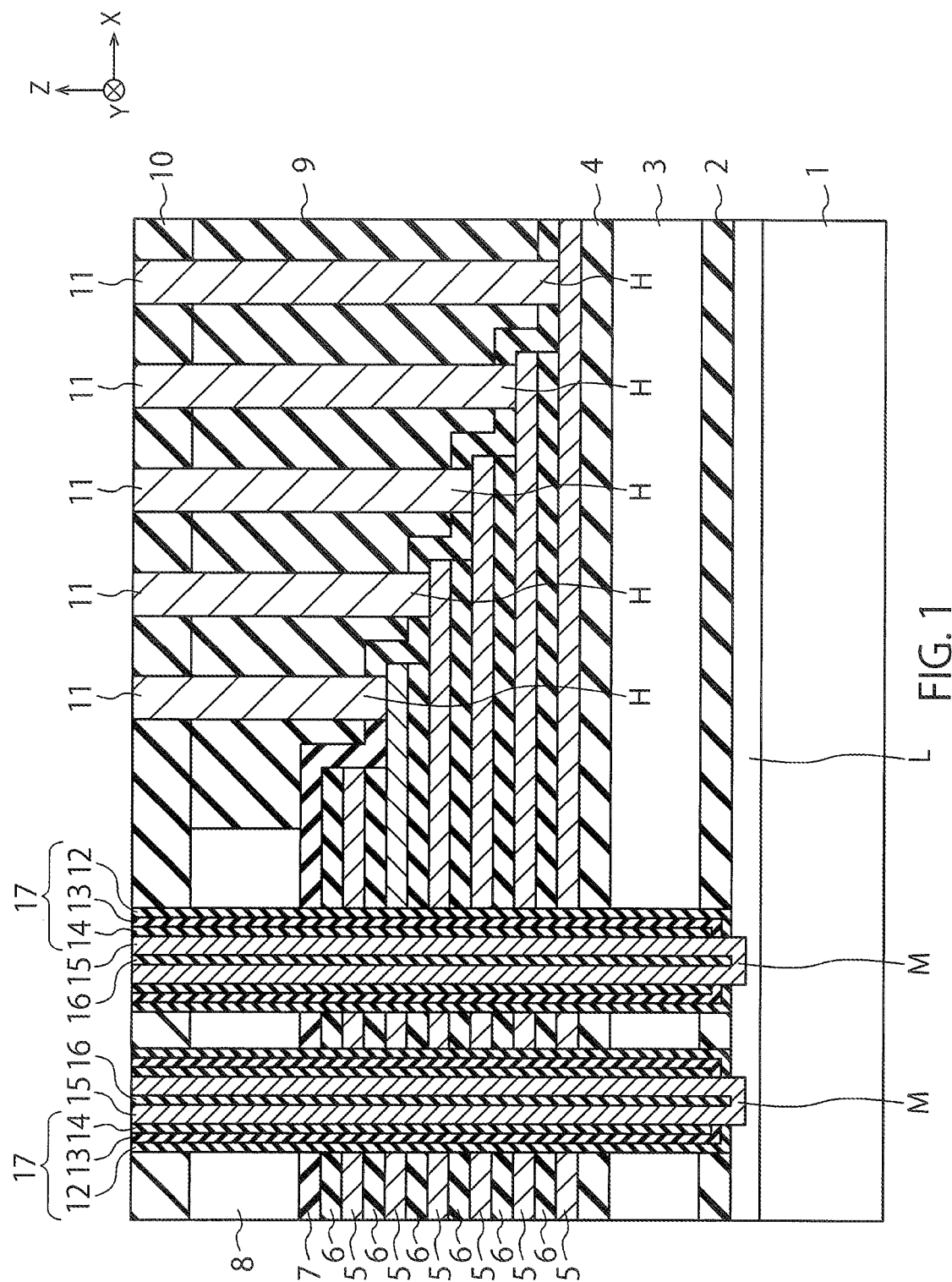
FIG. 1 is a cross-sectional view showing a configuration of a semiconductor storage device of a first embodiment.

FIG. 1 is a cross-sectional view showing a configuration of a semiconductor storage device of a first embodiment. The semiconductor storage device in FIG. 1 includes a three-dimensional semiconductor memory.

The semiconductor storage device in FIG. 1 includes a substrate 1, a lower insulator 2, a source-side conducting layer 3, an upper insulator 4, a plurality of electrode layers 5, a plurality of insulating layers 6, a cover insulator 7, a drain-side conducting layer 8, a first inter layer dielectric 9, a second inter layer dielectric 10, a plurality of contact plugs 11, block insulators 12 which are exemplarily second insulators, charge storage layers 13, tunnel insulators 14 which are exemplarily first insulators, channel semiconductor layers 15, and core insulators 16 which are exemplarily third insulators.

The substrate 1 is exemplarily a semiconductor substrate such as a Si (silicon) substrate. FIG. 1 shows an X-direction and a Y-direction which are parallel to a surface of the substrate and perpendicular to each other, and a Z-direction perpendicular to the surface of the substrate 1. In the specification, the +Z-direction is regarded as the upward direction, and the −Z-direction is regarded as the downward direction. The −Z-direction may coincide with the direction of gravity but does not have to coincide with the direction of gravity. The Z-direction is exemplarily a first direction.

The lower insulator 2 is formed on a diffusion layer L formed in the substrate 1. The source-side conducting layer 3 is formed on the lower insulator 2. The upper insulator 4 is formed on the source-side conducting layer 3.

The plurality of electrode layers 5 and the plurality of insulating layers 6 are alternately stacked on the upper insulator 4 and stacked in the Z-direction. The electrode layer 5 is a conducting layer such, for example, as a metal layer and functions as a word line or a selection line. The number of the electrode layers 5 is exemplarily 64 or more. The insulating layer 6 is exemplarily an $SiO_2$ film (silicon oxide film). The number of the insulating layers 6 is exemplarily 64 or more. FIG. 1 shows memory holes M penetrating the electrode layers 5 and the insulating layers 6, and contact holes H formed on a stepwise region of the electrode layers 5 and the insulating layers 6.

On a stacked body including these electrode layers 5 and insulating layers 6, the cover insulator 7 is formed. The drain-side conducting layer 8 is formed on the cover insulator 7 so as to be adjacent to the stepwise region. The first inter layer dielectric 9 is formed on the cover insulator 7 so as to be embedded in a space on and over the stepwise region. The second inter layer dielectric 10 is formed on the drain-side conducting layer 8 and the first inter layer dielectric 9.

The plurality of contact plugs 11 are formed in the contact holes H penetrating the cover insulator 7, the first inter layer dielectric 9 and the second inter layer dielectric 10. These contact plugs 11 are electrically connected to the respective electrode layers 5 different from one another. Each contact plug 11 is formed, for example, of a barrier metal layer such as a Ti-containing (titanium-containing) layer, and a plug material layer such as a W (tungsten) layer.

The block insulator 12, the charge storage layer 13, the tunnel insulator 14, the channel semiconductor layer 15 and the core insulator 16 are sequentially formed on the lateral surface of the memory hole M penetrating the lower insulator 2, the source-side conducting layer 3, the upper insulator 4, the electrode layers 5, the insulating layers 6, the cover insulator 7, the drain-side conducting layer 8 and the second inter layer dielectric 10. The block insulator 12 is exemplarily an $SiO_2$ film. While the charge storage layer 13 is exemplarily an SiN film (silicon nitride film), it may be a semiconductor layer such as a polysilicon layer or a polysilicongermanium layer. The tunnel insulator 14 is exemplarily an $SiO_2$ film. The channel semiconductor layer 15 is exemplarily a polysilicon layer or a polysilicongermanium layer and electrically connected to the substrate 1. The core insulator 16 is exemplarily an $SiO_2$ film. Numeral 17 designates a memory film including the block insulator 12, the charge storage layer 13 and the tunnel insulator 14. The core insulator 16 substantially has a circular columnar shape extending in the Z-direction. The channel semiconductor layer 15, the tunnel insulator 14, the charge storage layer 13 and the block insulator 12 substantially have circular cylindrical shapes extending in the Z-direction and sequentially, annularly surround the core insulator 16.

The block insulator 12, the charge storage layer 13, the tunnel insulator 14, the channel semiconductor layer 15 and the core insulator 16 are formed, for example, by the following procedure. First, the block insulator 12, the charge storage layer 13 and the tunnel insulator 14 are sequentially formed on the lateral surface and the bottom surface of the memory hole M. Next, the tunnel insulator 14, the charge storage layer 13 and the block insulator 12 are removed from the bottom surface of the memory hole M. After that, the channel semiconductor layer 15 and the core insulator 16 are sequentially embedded into the memory hole M.

Next, details of the channel semiconductor layer 15 and the tunnel insulator 14 of the present embodiment are described.

The channel semiconductor layer 15 of the present embodiment contains a trace amount of metal atoms. The concentration of the metal atoms in the channel semiconductor layer 15 is exemplarily $4.0 \times 10^{17}$ [atoms/cm$^3$] or less. In the present embodiment, these metal atoms are substantially uniformly distributed in the channel semiconductor layer 15. These metal atoms are exemplarily Ni (nickel) atoms. In the present embodiment, the thickness of the tunnel insulator 14 is exemplarily 5 nm or more and 10 nm or less, and the thickness of the channel semiconductor layer 15 is exemplarily 15 nm or less (preferably 10 nm or less).

For example, these thicknesses are the thickness of the tunnel insulator 14 in a direction perpendicular to the lateral surface of the memory hole M, the thickness of the channel semiconductor layer 15 in a direction perpendicular to the lateral surface of the memory hole M. In the present embodiment, the shape of the memory hole M is substantially a circular columnar shape extending in the Z-direction, and the shapes of the tunnel insulator 14 and the channel semiconductor layer 15 are substantially circular tube shapes extending in the Z-direction. Therefore, the direction perpendicular to the lateral surface of the memory hole M is substantially equal to a direction from the lateral surface toward the center axis of the memory hole M. For example, the +X direction and −X direction in FIG. 1 are examples of the direction from the lateral surface toward the center axis of the memory hole M.

In the present embodiment, after metal atoms are attached onto the surface of the channel semiconductor layer 15 before crystallization (semiconductor layer 21 mentioned later), the channel semiconductor layer 15 is crystallized. Thereby, the channel semiconductor layer 15 can be crystallized at low temperature, which can increase grain diameters of crystal grains in the channel semiconductor layer 15. As a result, a mobility in the channel semiconductor layer 15 can be increased, which can reduce the threshold voltage of memory cells in the three-dimensional semiconductor memory. While the channel semiconductor layer 15 is being crystallized, these metal atoms are incorporated into the channel semiconductor layer 15.

According to the present embodiment, by attaching metal atoms onto the surface of the channel semiconductor layer 15 before crystallization to crystallize the channel semiconductor layer 15, grain diameters of crystal grains in the channel semiconductor layer 15 can be set, for example, to be 80 nm or more and 1600 nm or less, for example. Such grain diameters can be realized, for example, by attaching such an amount of metal atoms that the concentration of the metal atoms in the channel semiconductor layer 15 is $5.0 \times 10^{17}$ [atoms/cm$^3$] or more onto the surface of the channel semiconductor layer 15.

Furthermore in the present embodiment, after the channel semiconductor layer 15 is crystallized, the metal atoms in the channel semiconductor layer 15 are partly removed. Thereby, the concentration of the metal atoms in the channel semiconductor layer 15 can be reduced to be $4.0 \times 10^{17}$ [atoms/cm$^3$] or less as mentioned above.

With the concentration of $5.0 \times 10^{17}$ [atoms/cm$^3$] or more before removal of metal atoms, the grain diameters of, for example, 80 nm or more and 1600 nm or less can be realized. Meanwhile, with the concentration of $4.0 \times 10^{17}$ [atoms/cm$^3$] or less after the removal of metal atoms, a leak current, for example, at the tunnel insulator 14 can be more reduced than in the case where metal atoms are not removed.

While the metal atoms of the present embodiment are exemplarily Ni atoms, they may be other metal atoms. For example, the metal atoms of the present embodiment desirably include atoms of at least any of Au (gold), Al (aluminum), Cu (copper), Ag (silver), Pd (palladium), Ni (nickel) and Pt (platinum) (first example). For example, the metal atoms of the present embodiment may include atoms of at least any of Mn (manganese), Rh (rhodium), Co (cobalt), Fe (iron), Cr (chromium), Ti (titanium), Nb (niobium), Jr (iridium), Ta (tantalum), Re (rhenium), Mo (molybdenum), V (vanadium), Hf (hafnium), Ru (ruthenium), Zr (zirconium) and W (tungsten) (second example). While both of the metal atoms of the first example and the metal atoms of the second example have an effect of reducing the crystallization temperature of the channel semiconductor layer 15, those of the first example are generally have a larger effect thereof than those of the second example.

For example, use of Al or Ti leads to an advantage that an insulator can be formed on the surface of the channel semiconductor layer 15 by performing an oxidizing treatment or a nitriding treatment after crystallization of the channel semiconductor layer 15. The presence of Al or Ti in the channel semiconductor layer 15 causes a concern that short channel characteristics of the tunnel insulator 14 and the channel semiconductor layer 15 deteriorate. Nevertheless, oxidizing or nitriding the channel semiconductor layer 15 containing Al can form an $AlO_x$ film or an AlN film as the insulator on the surface of the channel semiconductor layer 15, which can suppress the short channel characteristics from deteriorating. Likewise, oxidizing the channel semiconductor layer 15 containing Ti can form a $TiO_x$ film as the insulator on the surface of the channel semiconductor layer 15, which can suppress the short channel characteristics from deteriorating.

The channel semiconductor layer 15 may contain B (boron) atoms, P (phosphorus) atoms, or As (arsenic atoms) in addition to the metal atoms. The channel semiconductor layer 15 of the present embodiment contains B atoms, P atoms or As atoms in a concentration of, for example, $1.0 \times 10^{16}$ [atoms/cm$^3$] or more and $1.0 \times 10^{19}$ [atoms/cm$^3$] or less. Thereby, the threshold voltage of memory cells in the three-dimensional semiconductor memory can be adjusted to an appropriate value.

FIGS. 2A to 5B are cross-sectional views showing a method of manufacturing the semiconductor storage device of the first embodiment.

Figure 2A:
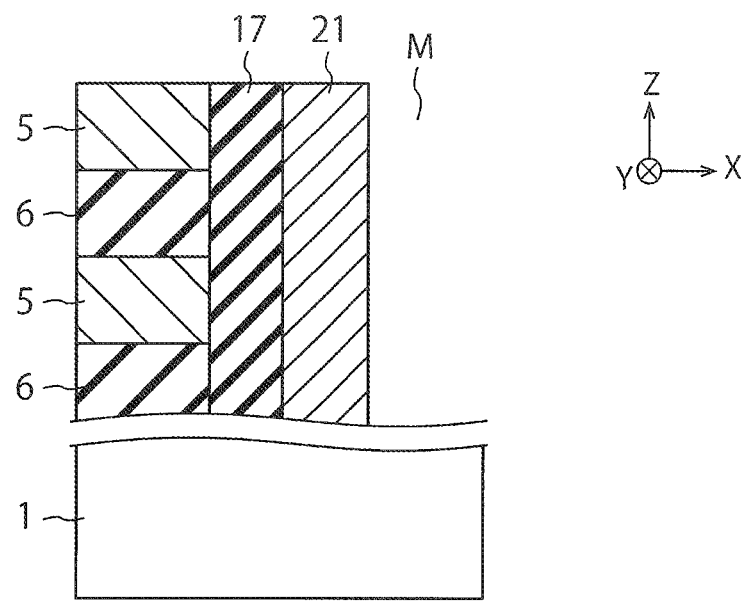
FIGS. 2A to 5B are cross-sectional views showing a method of manufacturing the semiconductor storage device of the first embodiment.

First, after the lower insulator 2, the source-side conducting layer 3 and the upper insulator 4 are sequentially formed on the substrate 1 (see FIG. 1), the plurality of electrode layers 5 and the plurality of insulating layers 6 are alternately stacked on the upper insulator 4 (FIG. 2A). Next, the memory hole M penetrating these electrode layers 5 and insulating layers 6 to reach the substrate 1 is formed (FIG. 2A). Next, the memory film 17 (the block insulator 12, the charge storage layer 13 and the tunnel insulator 14) and the semiconductor layer 21 are sequentially formed on the lateral surfaces of the electrode layers 5 and the insulating layers 6 in the memory hole M (FIG. 2A).

The semiconductor layer 21 is an amorphous semiconductor layer for forming the channel semiconductor layer 15 in FIG. 1, and is exemplarily an amorphous silicon layer. The semiconductor layer 21 is formed, for example, by LPCVD (Low Pressure Chemical Vapor Deposition) at a temperature of 400° C. to 600° C. and a pressure of 1 Pa to 500 Pa. Examples of a source gas for the semiconductor layer 21 include SiH$_4$ gas, Si$_2$H$_6$ gas, SiH$_2$Cl$_2$ gas, Si$_2$Cl$_6$ gas, organic gas containing Si, and the like (H denotes hydrogen and Cl denotes chorine). Moreover, the thickness of the tunnel insulator 14 is set, for example, to be 5 nm or more and 10 nm or less, and the thickness of the semiconductor layer 21 is set, for example, to be 15 nm or less (preferably 10 nm or less).

In the step of FIG. 2A, in place of alternately stacking the plurality of electrode layers 5 and the plurality of insulating layers 6 on the upper insulator 4, a plurality of sacrificial layers and the plurality of insulating layers 6 may be alternately stacked on the upper insulator 4. The sacrificial layers are exemplarily SiN films. In this case, the sacrificial layers are replaced by the electrode layers 5 in a step afterward. Specifically, the sacrificial layers between the insulating layers 6 are removed to form a plurality of hollows between the insulating layers 6, and the electrode layers 5 are embedded into these hollows.

Figure 2B:
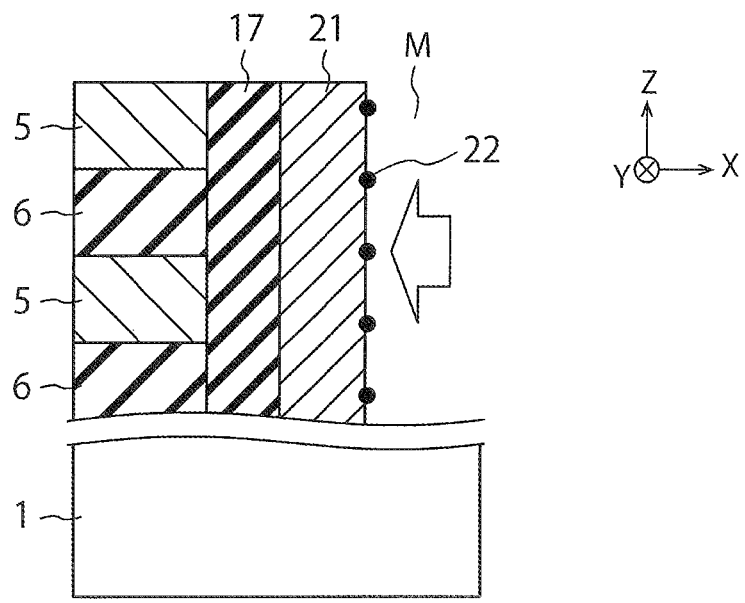

Next, liquid containing metal atoms 22 is supplied into the memory hole M (FIG. 2B). As a result, the metal atoms 22 are attached onto the lateral surface of the semiconductor layer 21. The metal atoms 22 are exemplarily Ni atoms and the liquid is exemplarily an aqueous Ni solution. In the present embodiment, the metal atoms 22 are attached onto the lateral surface of the semiconductor layer 21 such that the surface concentration of the metal atoms 22 on the lateral surface of the semiconductor layer 21 is $1.0 \times 10^{15}$ [atoms/cm$^2$] or less.

Figure 3A:
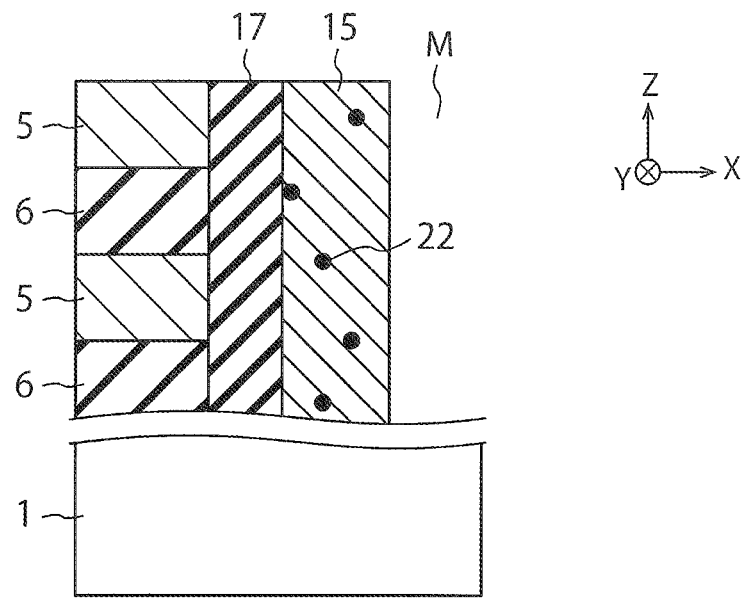

Next, the semiconductor layer 21 and the like are annealed at a temperature of 500° C. to 1000° C. and a pressure of 100 Pa to ambient pressure (FIG. 3A). As a result, the metal atoms 22 are incorporated into the semiconductor layer 21 and the semiconductor layer 21 is crystallized. FIG. 3A shows the channel semiconductor layer 15 obtained from the semiconductor layer 21 having changed. The channel semiconductor layer 15 is exemplarily a polysilicon layer. Each of the semiconductor layer 21 and the channel semiconductor layer 15 is exemplarily a first semiconductor layer. The annealing in the step of FIG. 3A may be performed in an atmosphere containing at least any of H$_2$ gas, D$_2$ (deuterium) gas, N$_2$ gas and noble gas.

The semiconductor layer 21 of the present embodiment is crystallized, for example, at a temperature of 500° C. to 1000° C. (for example, 500° C. to 800° C.) such that the concentration of the metal atoms 22 in the channel semiconductor layer 15 is $5.0 \times 10^{17}$ [atoms/cm$^3$] or more. Thereby, the semiconductor layer 21 can be crystallized such that the grain diameters of the crystal grains in the channel semiconductor layer 15 are 80 nm or more and 1600 nm or less.

In the present embodiment, after the annealing in the step of FIG. 3A, the channel semiconductor layer 15 may be further annealed at a higher temperature than the temperature of the annealing in the step of FIG. 3A. Thereby, crystallinity of the channel semiconductor layer 15 can be enhanced. This annealing may be performed in an atmosphere containing at least any of H$_2$ gas, D$_2$ gas, N$_2$ gas and noble gas.

Figure 3B:
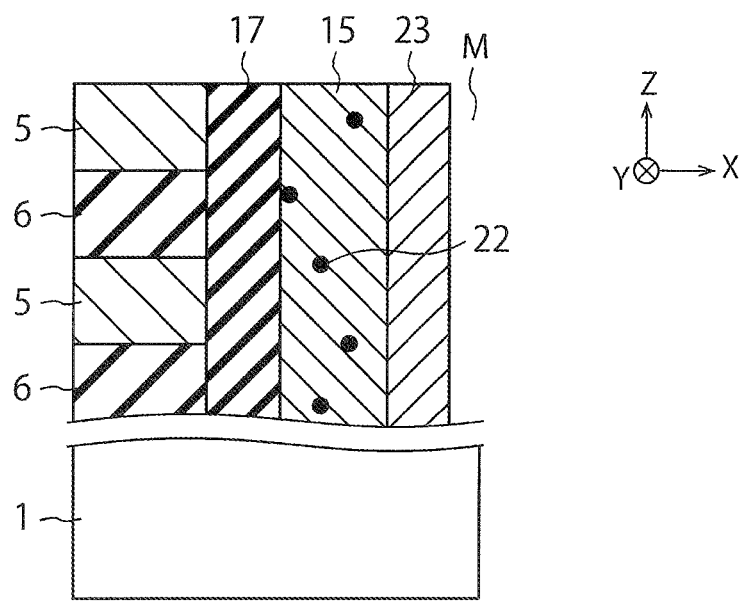

Next, a getter layer 23 is formed on the lateral surface of the channel semiconductor layer 15 in the memory hole M (FIG. 3B). The getter layer 23 is a semiconductor layer for taking out the metal atoms 22 from the channel semiconductor layer 15. The getter layer 23 of the present embodiment is exemplarily an amorphous semiconductor layer, and specifically, an amorphous silicon layer. The getter layer 23 may be an amorphous silicongermanium layer or an amorphous germanium layer. The getter layer 23 may be formed on the lateral surface of the channel semiconductor layer 15 via an insulator such as an SiO$_2$ film or a SiN film. The thickness of the getter layer 23 is set, for example, to be 3 nm to 30 nm. The getter layer 23 is exemplarily a second semiconductor layer. For example, this thickness is the thickness of the getter layer 23 in the direction perpendicular to the lateral surface of the memory hole M.

The getter layer 23 may contain O atoms, N atoms or C (carbon) atoms or may contain B atoms, P atoms or As atoms. Thereby, an amorphous state of the getter layer 23 can be maintained still at high temperature. The getter layer 23 of the present embodiment exemplarily contains P atoms in a concentration of $1.0 \times 10^{19}$ [atoms/cm$^3$] to $1.0 \times 10^{22}$ [atoms/cm$^3$] or B atoms in a concentration of $1.0 \times 10^{16}$ [atoms/cm$^3$] to $1.0 \times 10^{22}$ [atoms/cm$^3$]. The getter layer 23 may contain two or more kinds of atoms selected from O atoms, N atoms, C atoms, B atoms, P atoms and As atoms. For example, the getter layer 23 may contain both N atoms and B atoms.

Examples of a source gas for the getter layer 23 include SiH$_4$ gas, Si$_2$H$_6$ gas, SiH$_2$Cl$_2$ gas, Si$_2$Cl$_6$ gas, organic gas containing Si, and the like. The getter layer 23 is formed, for example, by LPCVD. C atoms are added to the getter layer 23, for example, using Si$_x$C$_y$H$_z$ gas (x, y and z are integers of one or more). O atoms are added to the getter layer 23, for example, using O$_2$ gas, O$_3$ gas, N$_2$O gas, NO gas or CO gas.

Figure 4A:
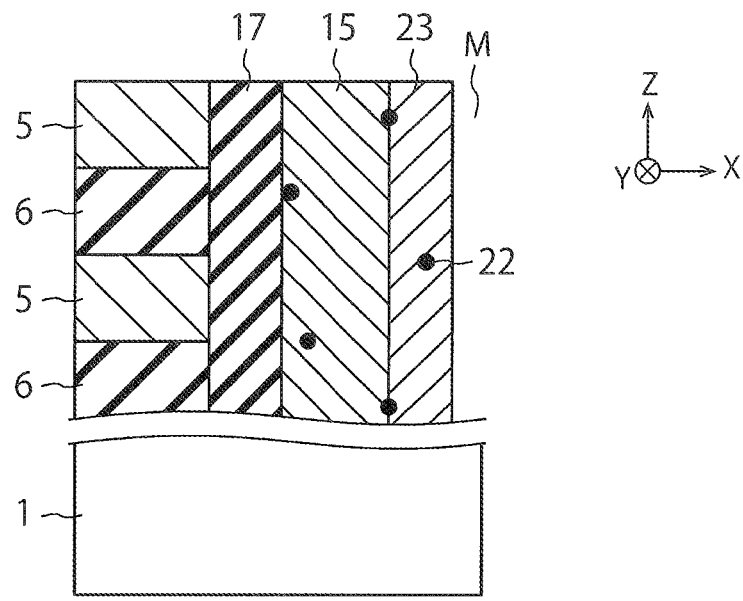

Next, the channel semiconductor layer 15, the getter layer 23 and the like are annealed at a temperature of 500° C. or more (FIG. 4A). As a result, the metal atoms 22 in the channel semiconductor layer 15 partly transfer to the getter layer 23, and the concentration (and the total amount) of the metal atoms 22 in the channel semiconductor layer 15 decrease(s). Thereby, the concentration of the metal atoms 22 in the channel semiconductor layer 15 can be reduced to be $4.0 \times 10^{17}$ [atoms/cm$^3$] or less. The annealing in the step of FIG. 4A may be performed in an atmosphere containing at least any of H$_2$ gas, D$_2$ gas, N$_2$ gas and noble gas. Otherwise, the annealing in the step of FIG. 4A may be performed in an oxidizing atmosphere or a reducing atmosphere containing O$_2$ gas, H$_2$O gas, O radicals or NH$_3$ gas.

Figure 4B:
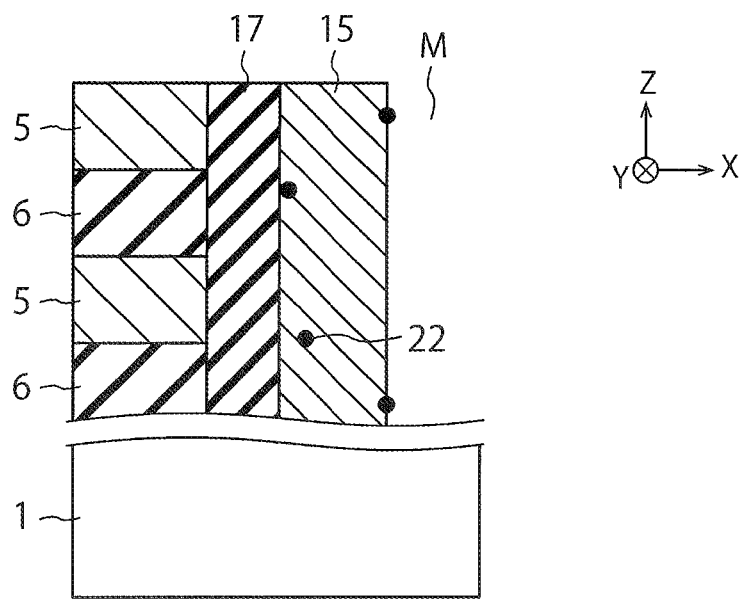

Next, the getter layer 23 is removed using a liquid chemical or etching gas while the channel semiconductor layer 15 is allowed to remain (FIG. 4B).

Figure 5A:
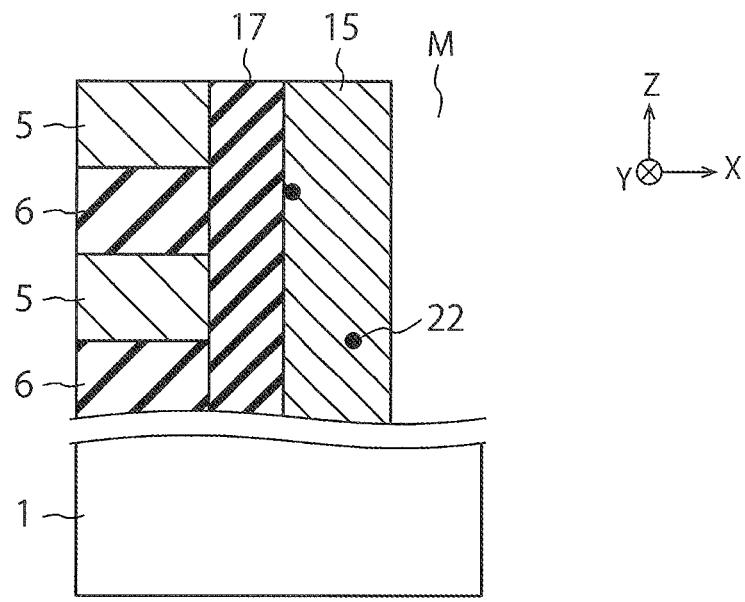

Next, the metal atoms 22 that remain on the lateral surface of the channel semiconductor layer 15 are removed, for example, using a liquid chemical (FIG. 5A).

After that, the steps in FIGS. 3B to 5A may be performed by additional one or more cycles. Thereby, the concentration of the metal atoms 22 in the channel semiconductor layer 15 can be further reduced. When the steps in FIGS. 3B to 5A are performed by a plurality of cycles, the concentration of the metal atoms 22 in the channel semiconductor layer 15 may reach $4.0 \times 10^{17}$ [atoms/cm$^3$] or less only after all these cycles complete.

Figure 5B:
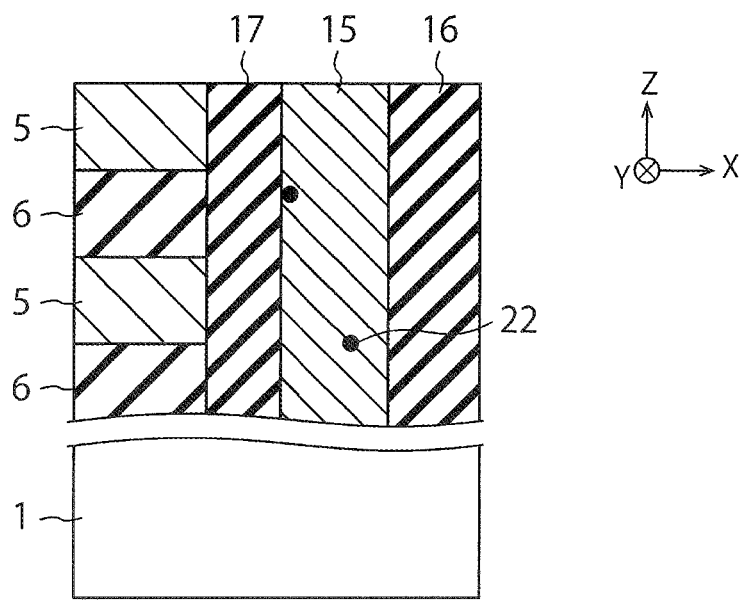

Next, the core insulator 16 is formed on the lateral surface of the channel semiconductor layer 15 in the memory hole M (FIG. 5B). As above, a memory cell is formed in the memory hole M.

There can be a case where even after the step in FIG. 5A to remove the metal atoms 22 that remain on the lateral surface of the channel semiconductor layer 15, some of the metal atoms 22 still remain on the lateral surface of the channel semiconductor layer 15. Moreover, the step in FIG. 5A may be omitted, and in this case, the metal atoms 22 are to remain in the channel semiconductor layer 15. When the metal atoms 22 remain on the lateral surface of the channel semiconductor layer 15 or in the channel semiconductor layer 15, the metal atoms 22 move to the interface between the core insulator 16 and the channel semiconductor layer 15 and the interface between the tunnel insulator 14 and the channel semiconductor layer 15 by a thermal process after the core insulator 16 is formed on the lateral surface of the channel semiconductor layer 15. In other words, the interface between the core insulator 16 and the channel semiconductor layer 15 and the interface between the tunnel insulator 14 and the channel semiconductor layer 15 are to contain the metal atoms 22. As a result, the channel semiconductor layer 15 possibly includes a portion with a lower concentration of the metal atoms 22 than the concentrations of the metal atoms 22 at the interface between the core insulator 16 and the channel semiconductor layer 15 and the interface between the tunnel insulator 14 and the channel semiconductor layer 15. For example, the metal atom concentrations at the interfaces possibly are "Ca", and the metal atom concentration of a portion in the channel semiconductor layer 15 possibly is "Cb" (<Ca). The reason is that the metal atom concentration in the channel semiconductor layer 15 decreases by the step in FIG. 4A.

After that, various interconnect layers, plug layers, inter layer dielectrics and the like are formed on the substrate 1. When the plurality of sacrificial layers and the plurality of insulating layers 6 are alternately stacked on the upper insulator 4 in the step of FIG. 2A, the sacrificial layers are replaced by the electrode layers 5 after the step in FIG. 5B. As above, the semiconductor storage device in FIG. 1 is manufactured.

While in the present embodiment, the concentration of the metal atoms 22 in the channel semiconductor layer 15 after the step in FIG. 3A is $5.0 \times 10^{17}$ [atoms/cm$^3$] or more and the concentration of the metal atoms 22 in the channel semiconductor layer 15 after the step in FIG. 4A is $4.0 \times 10^{17}$ [atoms/cm$^3$] or less, the concentrations after these steps may take other values. For example, the concentration of the metal atoms 22 in the channel semiconductor layer 15 after the step in FIG. 3A may be $4.0 \times 10^{17}$ [atoms/cm$^3$] or less. While in this case, the concentration of the metal atoms 22 in the channel semiconductor layer 15 after the step in FIG. 4A is also $4.0 \times 10^{17}$ [atoms/cm$^3$] or less similarly to the concentration after the step in FIG. 3A, it is lower than the concentration after the step in FIG. 3A.

Figure 6:
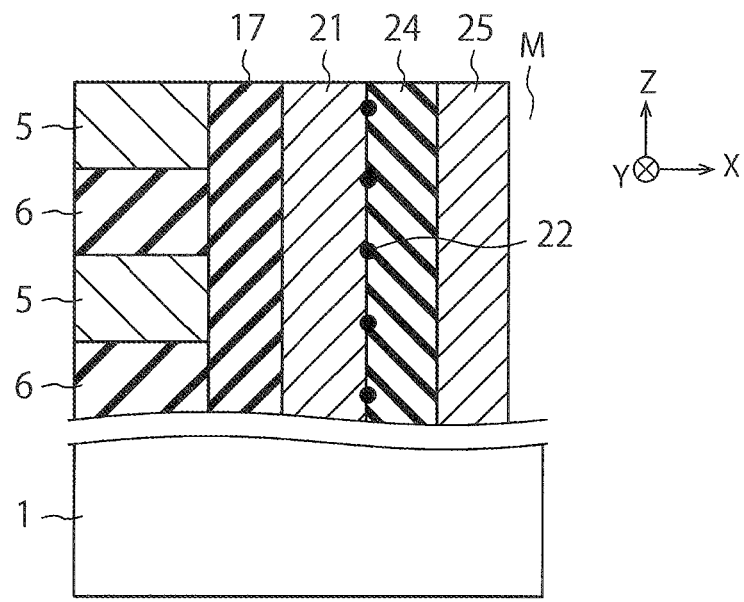
FIG. 6 is a cross-sectional view showing a method of manufacturing a semiconductor storage device of a first modification of the first embodiment.

FIG. 6 is a cross-sectional view showing a method of manufacturing a semiconductor storage device of a first modification of the first embodiment.

In the present modification, the step in FIG. 2B may be replaced by a step in FIG. 6. In the step of FIG. 6, a buffer layer 24 (insulator such, for example, as a SiN film) is formed on the lateral surface of the semiconductor layer 21, a metal layer 25 (Ni layer, for example) is formed on the lateral surface of the buffer layer 24, and the semiconductor layer 21, the buffer layer 24, the metal layer 25 and the like are annealed at a temperature of 300° C. to 450° C. As a result, the metal atoms 22 in the metal layer 25 (Ni atoms) are diffused into the buffer layer 24 and attached onto the lateral surface of the semiconductor layer 21. In the present modification, the metal atoms 22 are attached onto the lateral surface of the semiconductor layer 21 such that the surface concentration of the metal atoms 22 on the lateral surface of the semiconductor layer 21 is $1.0 \times 10^{15}$ [atoms/cm$^2$] or less. After that, the buffer layer 24 and the metal layer 25 are removed.

Figure 7:
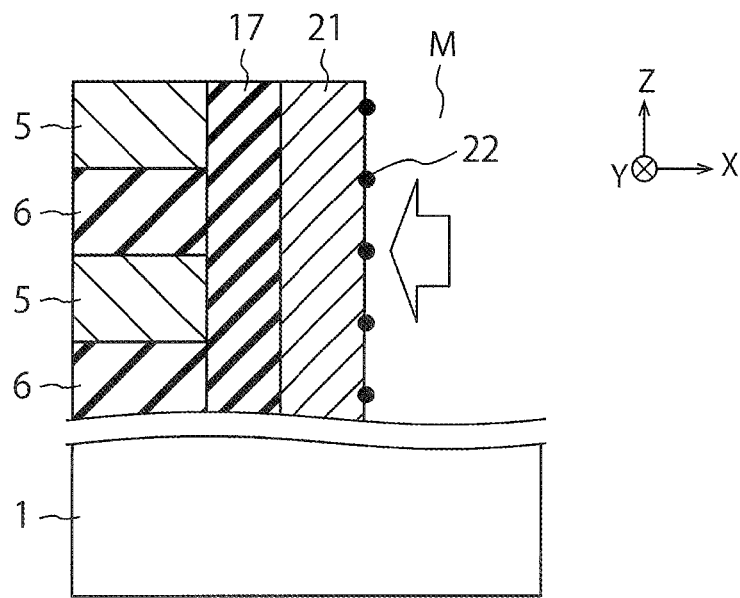
FIG. 7 is a cross-sectional view showing a method of manufacturing a semiconductor storage device of a second modification of the first embodiment.

FIG. 7 is a cross-sectional view showing a method of manufacturing a semiconductor storage device of a second modification of the first embodiment.

In the present modification, the step in FIG. 2B may be replaced by a step in FIG. 7. In the step of FIG. 7, gas containing the metal atoms 22 is supplied into the memory hole M. As a result, the metal atoms 22 (Ni atoms, for example) are attached onto the lateral surface of the semiconductor layer 21. In the present modification, the metal atoms 22 are attached onto the lateral surface of the semiconductor layer 21 such that the surface concentration of the metal atoms 22 on the lateral surface of the semiconductor layer 21 is $1.0 \times 10^{15}$ [atoms/cm$^2$] or less.

In the present embodiment, any of the steps in FIGS. 2B, 6 and 7 may be employed.

As above, the channel semiconductor layer 15 in the present embodiment is formed such that the grain diameters of the crystal grains in the channel semiconductor layer 15 are 80 nm or more and 1600 nm or less. Furthermore, the concentration of the metal atoms 22 in the channel semiconductor layer 15 of the present embodiment is adjusted to be $4.0 \times 10^{17}$ [atoms/cm$^3$] or less in the final stage. Therefore, according to the present embodiment, characteristics of the channel semiconductor layer 15 can be improved, for example, the mobility in the channel semiconductor layer 15 being increased while the leak current at the tunnel insulator 14 being suppressed.

While in the present embodiment, the metal atoms 22 are removed from the channel semiconductor layer 15 by forming the getter layer 23 on the lateral surface of the channel semiconductor layer 15 and causing the metal atoms 22 in the channel semiconductor layer 15 to transfer into the getter layer 23, the metal atoms 22 may be removed from the channel semiconductor layer 15 by another method. For example, gas may be supplied onto the lateral surface of the channel semiconductor layer 15, so that the metal atoms 22 can be removed from the channel semiconductor layer 15 through reaction of the gas with the metal atoms 22. Such gas is exemplarily sulfur gas.

Moreover, each crystal grain in the channel semiconductor layer 15 of the present embodiment desirably has a <100> orientation in a direction parallel to the thickness direction of the channel semiconductor layer 15. In the present embodiment, the shape of the memory hole M is substantially a circular columnar shape extending in the Z-direction, and the shape of the channel semiconductor layer 15 is substantially a circular tube shape extending in the Z-direction. Therefore, the thickness direction of the channel semiconductor layer 15 of the present embodiment is substantially a direction from the lateral surface toward the center axis of the memory hole M. A crystal grain having a <100> orientation in a direction parallel to the thickness direction of the channel semiconductor layer 15 is hereinafter called a <100> crystal grain.

Experiments revealed that a ratio of <100> crystal grains relative to all of the crystal grains in the channel semiconductor layer 15 increased more as the thickness of the channel semiconductor layer 15 decreased more. The experiments further revealed that when the thickness of the channel semiconductor layer 15 was 15 nm or less, the ratio of <100> crystal grains relative to all of the crystal grains in the channel semiconductor layer 15 took a value close to 100%, and that when the thickness of the channel semiconductor layer 15 was 10 nm or less, the ratio of <100> crystal grains relative to all of the crystal grains in the channel semiconductor layer 15 was almost 100%. Therefore, the thickness(es) of the channel semiconductor layer 15 (and the semiconductor layer 21) of the present embodiment is(are) desirably set to be 10 nm or less. Thereby, orientations of the crystal grains in the channel semiconductor layer 15 can be coordinated such that the crystal grains in the channel semiconductor layer 15 are <100> crystal grains. Thereby, characteristics of the channel semiconductor layer 15 (mobility, for example) can be further improved. In the present embodiment, a half or more of all of the crystal grains in the channel semiconductor layer 15 in each memory hole M each desirably has a <100> orientation in a direction parallel to the thickness direction of the channel semiconductor layer 15, and such a channel semiconductor layer 15 can be realized, for example, by setting the thickness of the channel semiconductor layer 15 to be small as above.

Figure 8A:
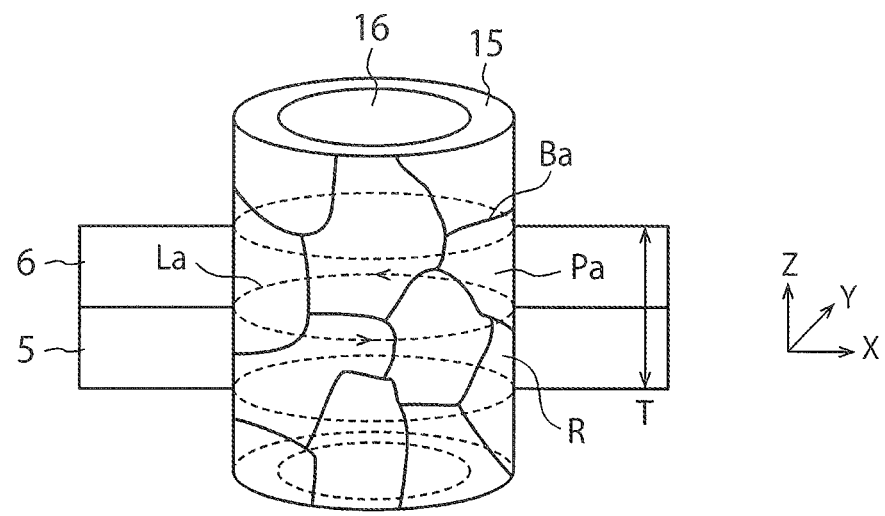
FIGS. 8A and 8B are perspective views for explaining a channel semiconductor layer of the first embodiment.
Figure 8B:
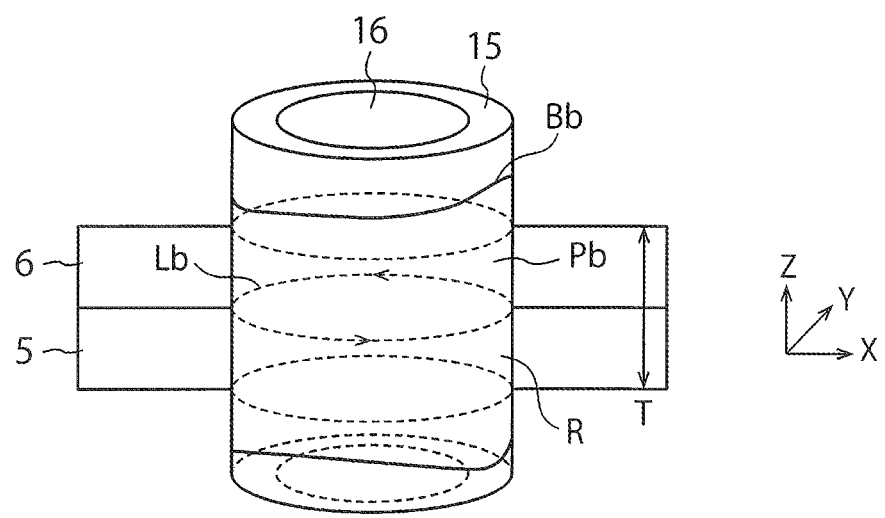

Moreover, since the channel semiconductor layer 15 of the present embodiment contains large diameter crystal grains, it possibly contains crystal grains having shapes annularly surrounding the core insulator 16. Crystal grains having such shapes are described with reference to FIGS. 8A and 8B. FIGS. 8A and 8B are perspective views for explaining the channel semiconductor layer 15 of the first embodiment.

FIG. 8A shows the channel semiconductor layer 15 and the core insulator 16 of a comparative example of the present embodiment. FIG. 8A further schematically shows an XZ-cross section of one electrode layer 5 and one insulating layer 6 adjacent to each other. The channel semiconductor layer 15 in FIG. 8A contains small diameter crystal grains like a crystal grain designated by sign Pa. Sign Ba designates a grain boundary between these crystal grains, and sign La designates one closed curve extending in the channel semiconductor layer 15 so as to round on the circumference of the core insulator 16. Each crystal grain in FIG. 8A like the crystal grain Pa does not have a shape annularly surrounding the core insulator 16. Therefore, the closed curve La cannot be drawn so as not to intersect the grain boundary Ba.

FIG. 8B shows the channel semiconductor layer 15 and the core insulator 16 of the present embodiment. FIG. 8B further schematically shows an XZ-cross section of one electrode layer 5 and one insulating layer 6 adjacent to each other. The channel semiconductor layer 15 in FIG. 8B contains large diameter crystal grains like a crystal grain designated by sign Pb. Sign Bb designates a grain boundary between these crystal grains, and sign Lb designates one closed curve extending in the channel semiconductor layer 15 so as to round on the circumference of the core insulator 16. The channel semiconductor layer 15 in FIG. 8B can contain a crystal grain having a shape annularly surrounding the core insulator 16 like the crystal grain Pb. In this case, the closed curve Lb can be drawn so as not to intersect the grain boundary Bb. The closed curve Lb in FIG. 8B actually extends in the crystal grain Pb so as not to intersect the grain boundary Bb. The channel semiconductor layer 15 of the present embodiment can have such nature.

FIG. 8B shows the total thickness T of the one electrode layer 5 and the one insulating layer 6, and a region R occupying a surface of the channel semiconductor layer 15. The region R is a circular cylindrical region surrounded by these electrode layer 5 and insulating layer 6 and has a height represented by T mentioned above. Since each crystal grain in the channel semiconductor layer 15 of the present embodiment is large, an arbitrary region R of the present embodiment does not have the grain boundary Bb or has only the grain boundary Bb between two crystal grains. In the region R shown in FIG. 8B, since the grain boundary Bb between the crystal grain Pb and the crystal grain thereabove is above the region R, and the grain boundary Bb between the crystal grain Pb and the crystal grain therebelow is below the region R, the grain boundary Bb does not exist in the region R. When the region R is set to be a region surrounded by the electrode layer 5 in FIG. 8B and the insulating layer 6 therebelow, only the grain boundary Bb between two crystal grains exists in the region R.

It should be noted, on the other hand, that the region R shown in FIG. 8A has the grain boundaries Ba between three or more crystal grains. The cause of this is that each crystal grain of the channel semiconductor layer 15 of this comparative example is small.

The semiconductor storage device of the present embodiment includes a plurality of memory holes M, and each memory hole M includes the channel semiconductor layer 15. In the present embodiment, the crystal grains having shapes annularly surrounding the core insulators 16 like the crystal grain Pb may exist in the channel semiconductor layers 15 in all of the memory holes M or may exist only in the channel semiconductor layers 15 in some of the memory holes M. According to the present embodiment, even in the latter case, variation in a threshold voltage distribution and read noise can be reduced, and performance regarding cell currents can be improved.

Second Embodiment

Figure 9:
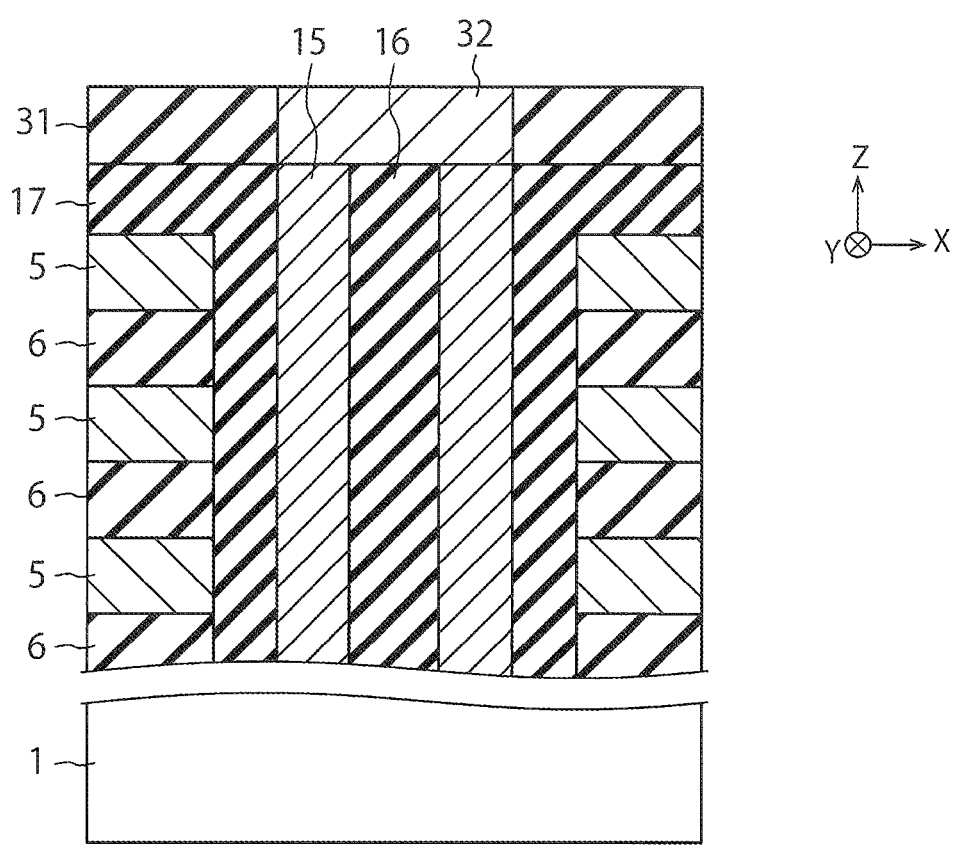
FIG. 9 is a cross-sectional view showing a configuration of a semiconductor storage device of a second embodiment.

FIG. 9 is a cross-sectional view showing a configuration of a semiconductor storage device of a second embodiment.

Similarly to FIG. 1, FIG. 9 shows the memory film 17, the channel semiconductor layer 15 and the core insulator 16 which are sequentially formed in the electrode layers 5 and the insulating layers 6 on the substrate 1. It should be noted that the memory film 17 of the present embodiment is also formed on the upper surface of the stacked structure of the electrode layers 5 and the insulating layers 6. As shown in FIG. 9, the semiconductor storage device of the present embodiment further includes an inter layer dielectric 31 and an interconnect layer 32.

The inter layer dielectric 31 is formed on the memory film 17. The inter layer dielectric 31 is exemplarily an SiO$_2$ film.

The interconnect layer 32 is formed in the inter layer dielectric 31 and positioned on the channel semiconductor layer 15 and the core insulator 16. Specifically, the channel semiconductor layer 15 and the core insulator 16 have shapes extending in the Z-direction, and the interconnect layer 32 is formed on the upper ends of these channel semiconductor layer 15 and core insulator 16. The interconnect layer 32 is exemplarily a semiconductor layer such as a polysilicon layer or a polysilicongermanium layer. The interconnect layer 32 may be a metal layer. The interconnect layer 32 of the present embodiment is electrically connected to the channel semiconductor layer 15 and functions as a contact plug.

FIGS. 10A to 13B are cross-sectional views showing a method of manufacturing the semiconductor storage device of the second embodiment. Description of matters in common with the method of manufacturing the semiconductor storage device of the first embodiment is omitted.

Figure 10A:
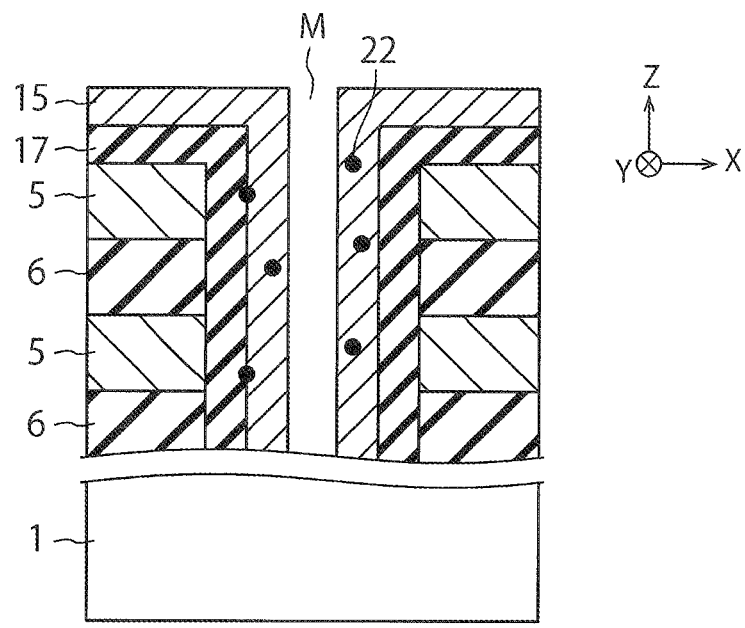
FIGS. 10A to 13B are cross-sectional views showing a method of manufacturing the semiconductor storage device of the second embodiment.

First, after the lower insulator 2, the source-side conducting layer 3 and the upper insulator 4 are sequentially formed on the substrate 1 (see FIG. 1), the plurality of electrode layers 5 and the plurality of insulating layers 6 are alternately stacked on the upper insulator 4 (FIG. 10A). Next, the memory hole M penetrating these electrode layers 5 and insulating layers 6 to reach the substrate 1 is formed (FIG. 10A). Next, the memory film 17 (the block insulator 12, the charge storage layer 13 and the tunnel insulator 14) and the channel semiconductor layer 15 before crystallization are sequentially formed on the lateral surfaces of the electrode layers 5 and the insulating layers 6 in the memory hole M (FIG. 10A). The channel semiconductor layer 15 before crystallization is the same as the semiconductor layer 21 of the first embodiment. The memory film 17 and the channel semiconductor layer 15 are also formed on the upper surface of the stacked structure of the electrode layers 5 and the insulating layers 6. The channel semiconductor layer 15 is exemplarily the first semiconductor layer.

Next, the steps in FIGS. 2B and 3A are performed (FIG. 10A). As a result, the metal atoms 22 are incorporated into the channel semiconductor layer 15 and the channel semiconductor layer 15 is crystallized. The channel semiconductor layer 15 of the present embodiment is crystallized at a temperature of 500° C. to 1000° C. (for example, 500° C. to 800° C.) such that the concentration of the metal atoms 22 in the channel semiconductor layer 15 is 5.0×10$^{17}$ [atoms/cm$^3$] or more, for example. Thereby, the channel semiconductor layer 15 can be crystallized such that the grain diameters of the crystal grains in the channel semiconductor layer 15 are 80 nm or more and 1600 nm or less. The step in FIG. 2B may be replaced by the step in FIG. 6 or FIG. 7.

Figure 10B:
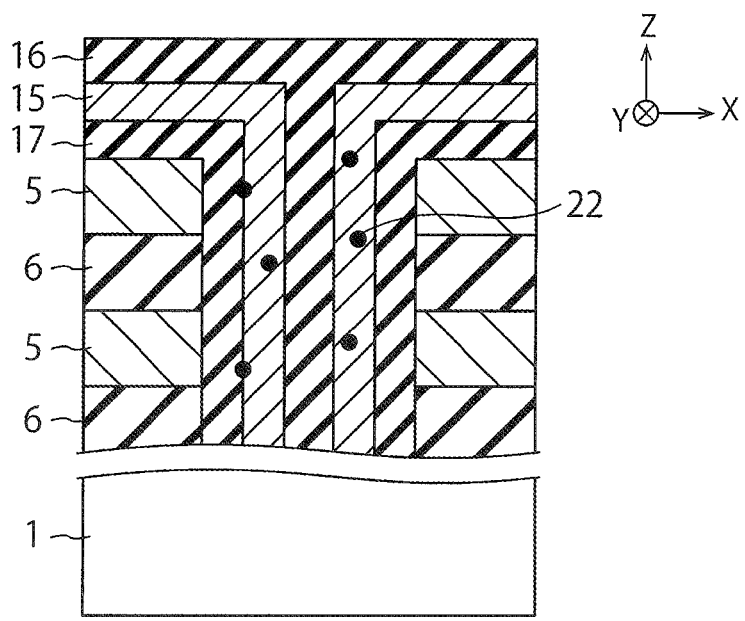

Next, the core insulator 16 is formed on the lateral surface of the channel semiconductor layer 15 in the memory hole M (FIG. 10B). The core insulator 16 is also formed on the upper surface of the stacked structure of the electrode layers 5 and the insulating layers 6 via the memory film 17 and the channel semiconductor layer 15.

Figure 11A:
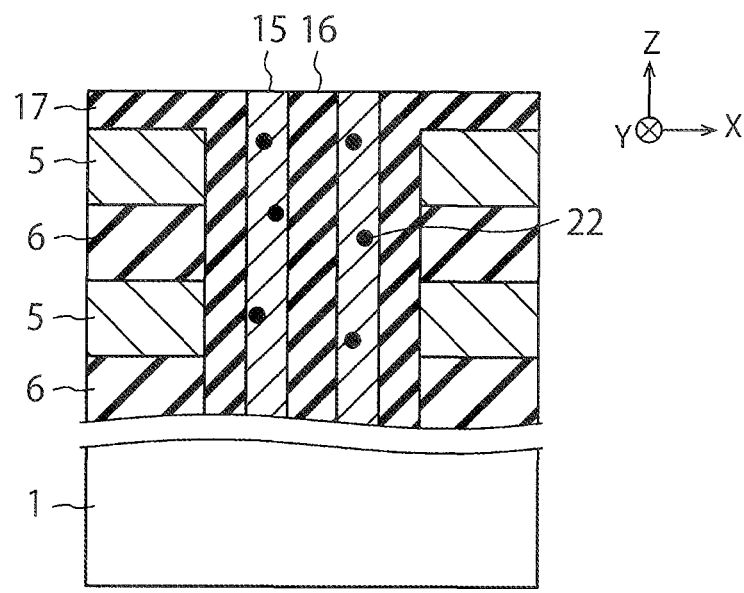

Next, parts of the core insulator 16 and the channel semiconductor layer 15 outside the memory hole M are removed by etching-back (FIG. 11A). This etching-back is performed until the upper surface of the memory film 17 is exposed. The etching-back is performed, for example, by RIE (Reactive Ion Etching), wet etching or CDE (Chemical Dry Etching).

Figure 11B:
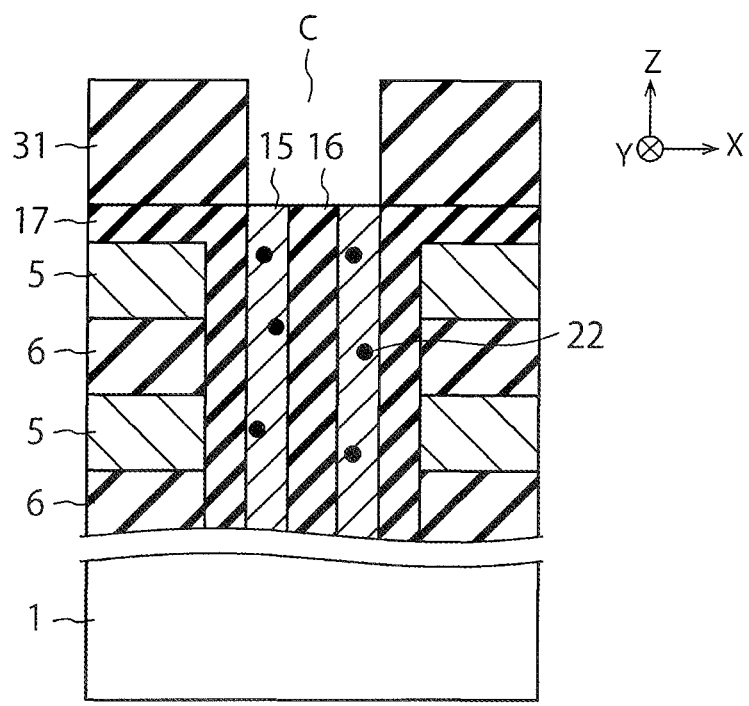

Next, after the inter layer dielectric 31 is formed over the whole surface of the substrate 1, an opening part C is formed in the inter layer dielectric 31 (FIG. 11B). As a result, the upper ends of the core insulator 16 and the channel semiconductor layer 15 are exposed in the opening part C.

Figure 12A:
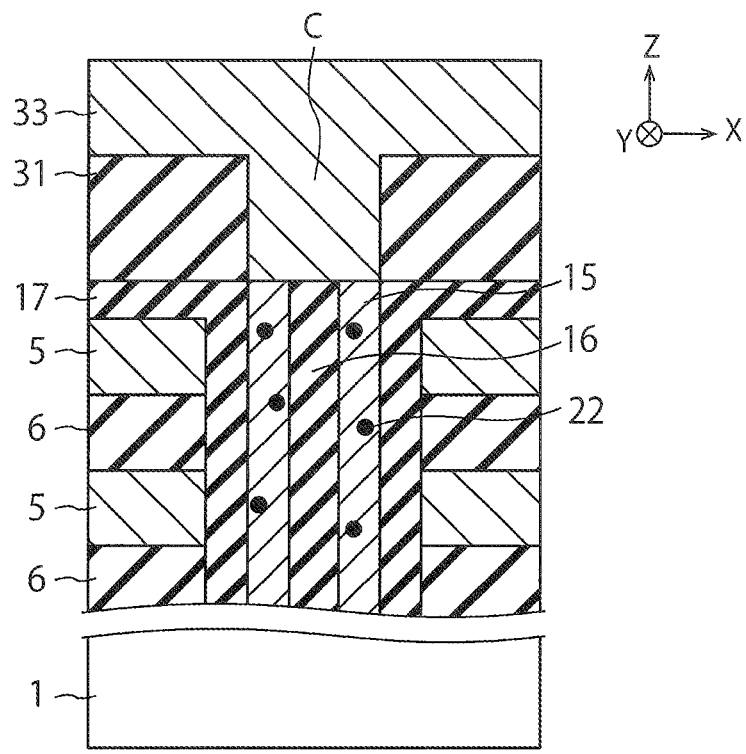

Next, a getter layer 33 is formed over the whole surface of the substrate 1 (FIG. 12A). As a result, a part of the getter layer 33 enters the opening part C and the getter layer 33 is formed on the upper ends of the core insulator 16 and the channel semiconductor layer 15. As the material of, contents in, and method of forming the getter layer 33, ones similar to those for the getter layer 23 of the first embodiment can be employed. The getter layer 33 may be formed on the upper end of the channel semiconductor layer 15 via an insulator such as an SiO$_2$ film or a SiN film. The thickness of the getter layer 33 is set, for example, to be 400 nm or less. The getter layer 33 is exemplarily the second semiconductor layer.

Figure 12B:
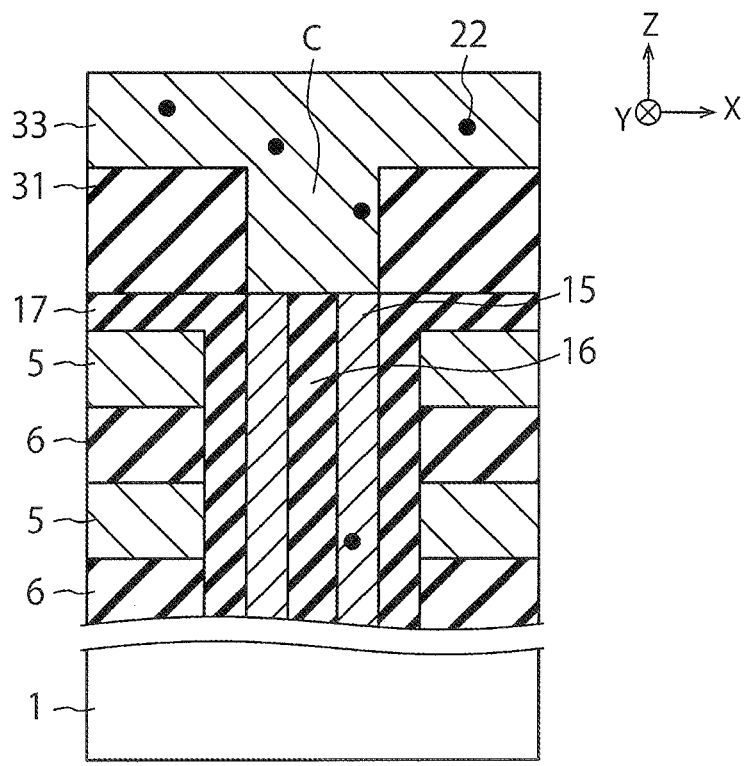

Next, the channel semiconductor layer 15, the getter layer 33 and the like are annealed at a temperature of 500° C. or more (FIG. 12B). As a result, the metal atoms 22 in the channel semiconductor layer 15 partly transfer to the getter layer 33, and the concentration of the metal atoms 22 in the channel semiconductor layer 15 decreases. Thereby, the concentration of the metal atoms 22 in the channel semiconductor layer 15 can be reduced to be 4.0×10$^{17}$ [atoms/cm$^3$] or less. The annealing in the step of FIG. 12B may be performed in an atmosphere containing at least any of H$_2$ gas, D$_2$ gas, N$_2$ gas and noble gas. Otherwise, the annealing in the step of FIG. 12B may be performed in an oxidizing atmosphere or a reducing atmosphere containing O$_2$ gas, H$_2$O gas, O radicals or NH$_3$ gas.

Figure 13A:
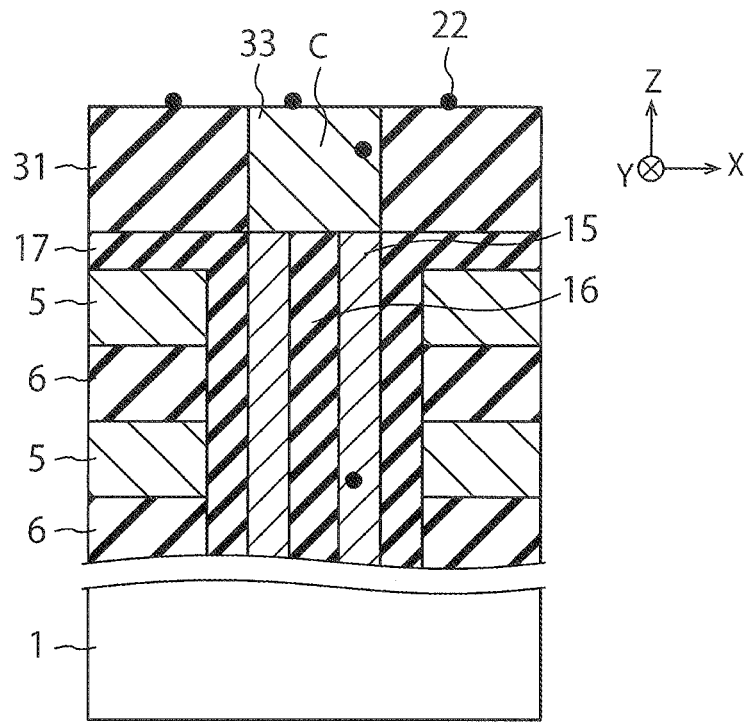

Next, the getter layer 33 outside the opening part C is removed (FIG. 13A). The getter layer 33 may be removed with a liquid chemical such as an aqueous choline solution or may be removed with etching gas such as Cl$_2$ gas, HCl gas or HBr gas. Otherwise, the getter layer 33 may be removed by CMP (Chemical Mechanical Polishing) or RIE.

Figure 13B:
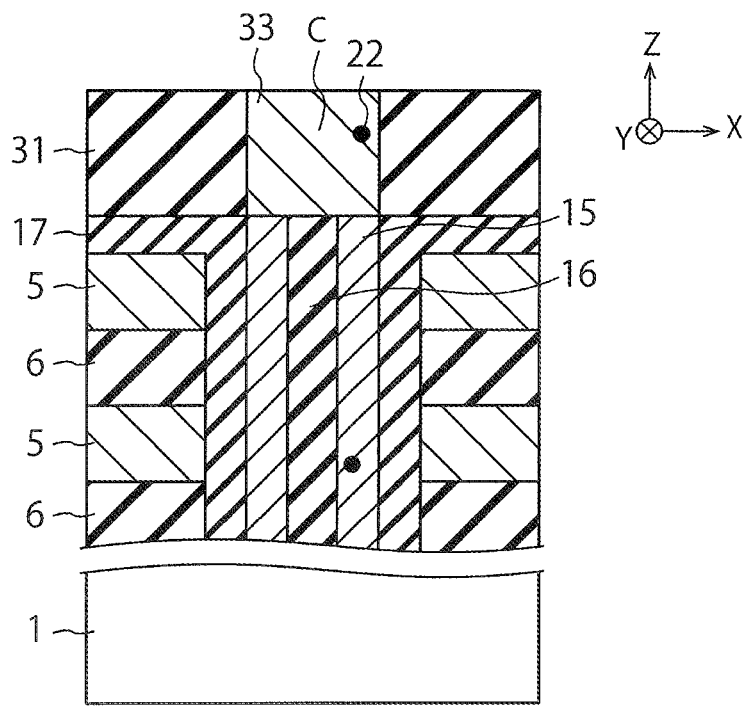

Next, the metal atoms 22 that remain on the upper surfaces of the getter layer 33 and the inter layer dielectric 31 are removed (FIG. 13B). In the present embodiment, these metal atoms 22 remain in a form of NiSi$_x$ by way of example on the upper surfaces of the getter layer 33 and the inter layer dielectric 31, and are removed from the upper surfaces of the getter layer 33 and the inter layer dielectric 31 with a liquid chemical containing HF and H$_2$O$_2$ or a liquid chemical containing HF and O$_3$.

After that, the steps in FIGS. 12A to 13B may be performed by additional one or more cycles. Thereby, the concentration of the metal atoms 22 in the channel semiconductor layer 15 can be further reduced. When the steps in FIGS. 12A to 13B are performed by a plurality of cycles, the concentration of the metal atoms 22 in the channel semiconductor layer 15 may reach 4.0×10$^{17}$ [atoms/cm$^3$] or less only after all these cycles complete. Moreover, when the step in FIG. 12A is started again, not only the getter layer 33 outside the opening part C but also the getter layer 33 inside the opening part C may be removed in the previous step of FIG. 13A.

After that, various interconnect layers, plug layers, inter layer dielectrics and the like are formed on the substrate 1. The getter layer 33 inside the opening part C may be removed or may remain. In the former case, after the getter layer 33 is removed from the opening part C, the interconnect layer 32 is formed in the opening part C. In the latter case, the getter layer 33 inside the opening part C is used for the interconnect layer 32 as it is. The interconnect layer 32 in the latter case is to contain a trace amount of metal atoms 22 and is to have the same orientation as the orientation of the channel semiconductor layer 15. In the latter case, when the getter layer 33 is formed via a thin insulator on the upper end of the channel semiconductor layer 15 in the step of FIG. 12A, an opening part is formed in this insulator when the metal atoms 22 in the channel semiconductor layer 15 transfer to the getter layer 33 in the step of FIG. 12B. As a result, the getter layer 33 is electrically connected to the channel semiconductor layer 15. The semiconductor storage device in FIG. 9 is manufactured as above.

More details of the channel semiconductor layer 15 of the second embodiment are hereafter described with reference to FIGS. 14 to 16. The following description can also be applied to the channel semiconductor layers 15 of the first embodiment and a third embodiment.

Figure 14:
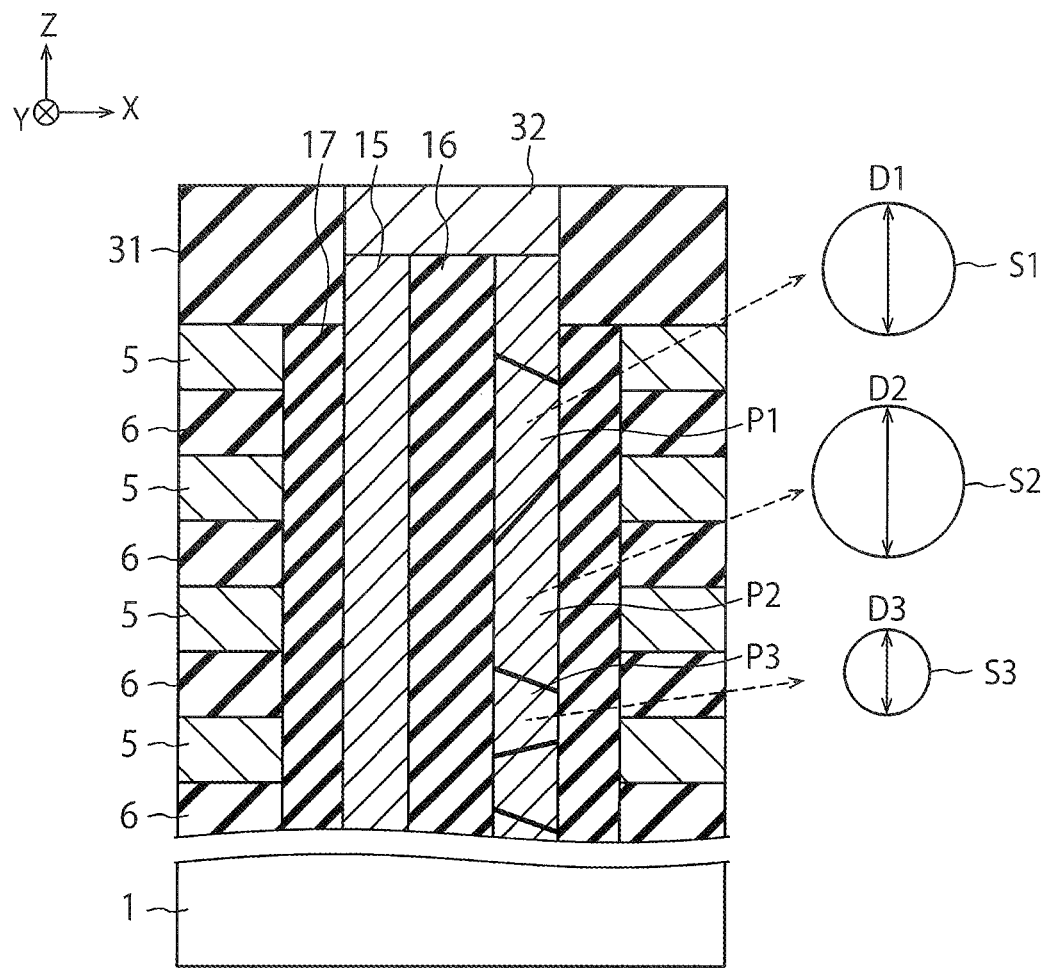
FIG. 14 is a diagram for explaining grain diameters of crystal grains of the second embodiment.

FIG. 14 is a diagram for explaining the grain diameters of the crystal grains of the second embodiment.

Similarly to FIG. 9, FIG. 14 shows an XZ-cross section of the semiconductor storage device of the present embodiment. FIG. 14 further schematically shows crystal grains P1, P2 and P3 as examples of the crystal grains in the channel semiconductor layer 15.

The grain diameters of the crystal grains in the channel semiconductor layer 15 in the present embodiment are calculated, for example, as follows.

First, cross-sectional grain diameter analysis is performed on the channel semiconductor layer 15 by ACOM-TEM (Automated Crystal Orientation Mapping in Transmission Electron Microscope). This analysis allows calculation of the area of a cross section of each crystal grain in a cross section of the channel semiconductor layer 15 (for example, one TEM image thereof). The XZ-cross section in FIG. 14 is an example of such a cross section. For example, the area of the crystal grain P1, the area of the crystal grain P2, the area of the crystal grain P3, and the like are calculated.

Next, the diameter of the circle having the same area as the area of each crystal grain is calculated. FIG. 14 shows a circle S1 having the same area as the area of the crystal grain P1, a circle S2 having the same area as the area of the crystal grain P2, and a circle S3 having the same area as the area of the crystal grain P3. FIG. 14 further shows a diameter D1 of the circle S1, a diameter D2 of the circle S2, and a diameter D3 of the circle S3. For example, the diameter D1 is calculated from the area of the crystal grain P1, the diameter D2 is calculated from the area of the crystal grain P2, and the diameter D3 is calculated from the area of the crystal grain P3.

Next, for all of the crystal grains contained in the cross section above in the channel semiconductor layer 15, the average value of the diameters above is calculated. In the present embodiment, this average value is used as the grain diameter of the crystal grains in the channel semiconductor layer 15. Therefore, in the present embodiment, this average value is 80 nm or more and 1600 nm or less. Crystal grains images of which are partially captured in the cross section above when the average value is calculated may be ruled out from the calculation targets for the average value.

Figure 15:
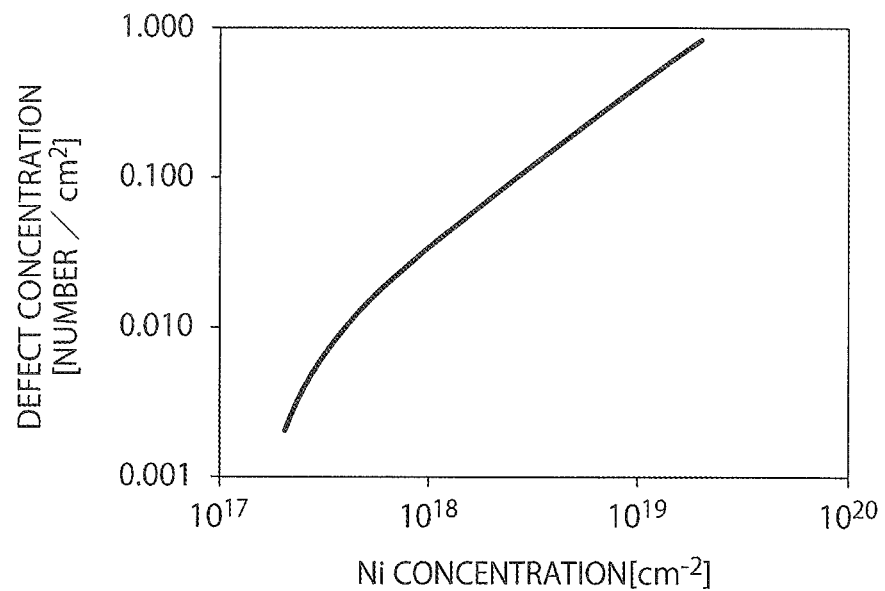
FIG. 15 is a graph for explaining the semiconductor storage device of the second embodiment.

FIG. 15 is a graph for explaining the semiconductor storage device of the second embodiment.

The abscissas in FIG. 15 represent the concentration of the metal atoms 22 (Ni atoms) in the channel semiconductor layer 15, and the ordinates in FIG. 15 represent a two-dimensional concentration of defects in the tunnel insulator 14. Specifically, this two-dimensional concentration indicates the number of defects per unit area in the thickness direction when the lateral surface of the tunnel insulator 14 is segmented into unit areas. FIG. 15 shows measurement results of these concentrations. It is apparent from FIG. 15 that the defect concentration in the tunnel insulator 14 increases as the concentration of the metal atoms 22 in the channel semiconductor layer 15 increases.

The tunnel insulator 14 of the present embodiment is a thin film, and specifically, has a thickness of 5 nm or more and 10 nm or less. When the tunnel insulator 14 is a thin film, a leak current highly possibly arises at the tunnel insulator 14. Therefore, in order to suppress such a leak current, it is desirable to suppress defects from arising in the tunnel insulator 14 as much as possible, and specifically, to suppress a defect concentration in the tunnel insulator 14 to be 0.01 [defects/cm$^2$] or less. When the graph in FIG. 15 is applied to this defect concentration, the concentration of the metal atoms 22 in the channel semiconductor layer 15 is desirably $4.0 \times 10^{17}$ [atoms/cm$^3$] or less. Therefore, in the present embodiment, the concentration of the metal atoms 22 in the channel semiconductor layer 15 is reduced to be $4.0 \times 10^{17}$ [atoms/cm$^3$] or less by partly removing the metal atoms 22 in the channel semiconductor layer 15 after the channel semiconductor layer 15 is crystallized.

Figure 16:
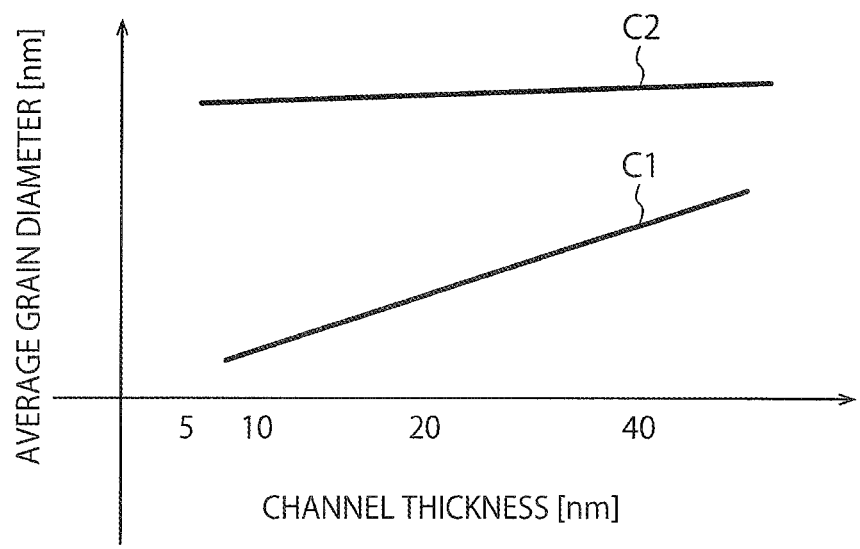
FIG. 16 is another graph for explaining the semiconductor storage device of the second embodiment.

FIG. 16 is another graph for explaining the semiconductor storage device of the second embodiment.

The abscissas in FIG. 16 represent the thickness of the channel semiconductor layer 15, and the ordinates in FIG. 16 represent the grain diameter of the crystal grains in the channel semiconductor layer 15. This grain diameter is the average grain diameter (average value of the diameters) described with reference to FIG. 14. In FIG. 16, a curve C1 denotes the average grain diameter in the channel semiconductor layer 15 formed without using the metal atoms 22, and a curve C2 denotes the average grain diameter in the channel semiconductor layer 15 of the present embodiment. It is apparent from FIG. 16 that forming the channel semiconductor layer 15 using the metal atoms 22 can make the average grain diameter in the channel semiconductor layer 15 large.

As above, the channel semiconductor layer 15 of the present embodiment is formed such that the grain diameters of the crystal grains in the channel semiconductor layer 15 are 80 nm or more and 1600 nm or less. Furthermore, the concentration of the metal atoms 22 in the channel semiconductor layer 15 of the present embodiment is adjusted to be $4.0 \times 10^{17}$ [atoms/cm$^3$] or less in the final stage. Therefore, similarly to the first embodiment, according to the present embodiment, characteristics of the channel semiconductor layer 15 can be improved, for example, the mobility in the channel semiconductor layer 15 being increased while the leak current at the tunnel insulator 14 being suppressed.

Moreover, in the present embodiment, the concentration of the metal atoms 22 in the channel semiconductor layer 15 is adjusted by forming the getter layer 33 outside the memory hole M, not inside the memory hole M. Such a method is effective, for example, when it is difficult to form the getter layer 33 in the memory hole M. Meanwhile, the method of the first embodiment is effective, for example, when the contact area between the channel semiconductor layer 15 and the getter layer 23 is wanted to be large.

Third Embodiment

FIGS. 17A to 18B are cross-sectional views showing a method of manufacturing a semiconductor storage device of a third embodiment. In the present embodiment, the semiconductor storage device in FIG. 9 is manufactured by a different method from that of the second embodiment. Description of matters in common with the method of manufacturing the semiconductor storage device of the second embodiment is omitted.

Figure 17A:
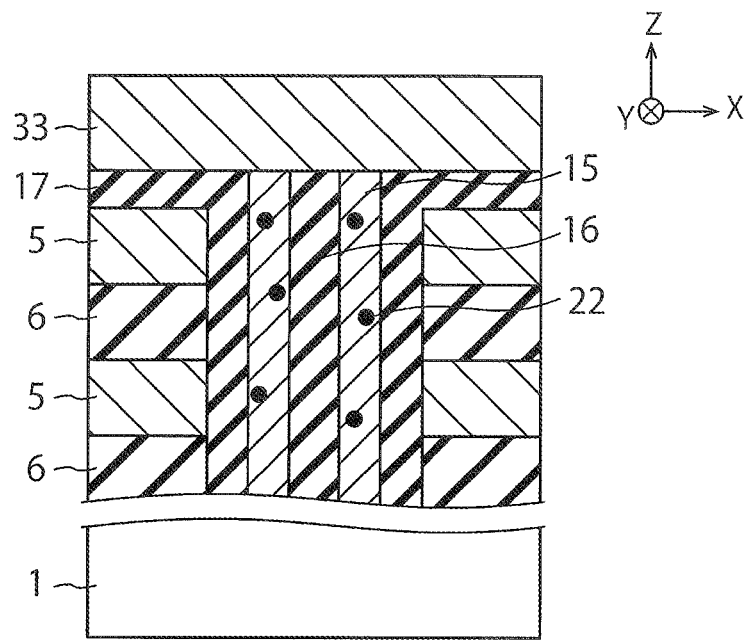
FIGS. 17A to 18B are cross-sectional views showing a method of manufacturing a semiconductor storage device of the third embodiment.

First, the steps in FIGS. 10A to 11A are performed (FIG. 17A). Next, the getter layer 33 is formed over the whole surface of the substrate 1 (FIG. 17A). As a result, the getter layer 33 is formed on the upper surface of the memory film 17 and the upper ends of the core insulator 16 and the channel semiconductor layer 15.

Figure 17B:
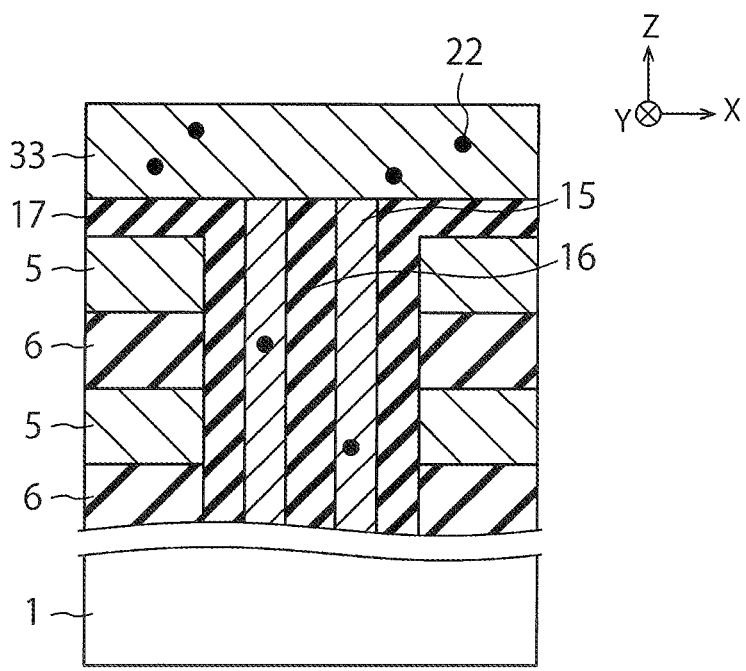

Next, the channel semiconductor layer 15, the getter layer 33 and the like are annealed at a temperature of 500° C. or more (FIG. 17B). As a result, the metal atoms 22 in the channel semiconductor layer 15 partly transfer to the getter layer 33, and the concentration of the metal atoms 22 in the channel semiconductor layer 15 decreases. Thereby, the concentration of the metal atoms 22 in the channel semiconductor layer 15 can be reduced to be $4.0 \times 10^{17}$ [atoms/cm$^3$] or less.

Figure 18A:
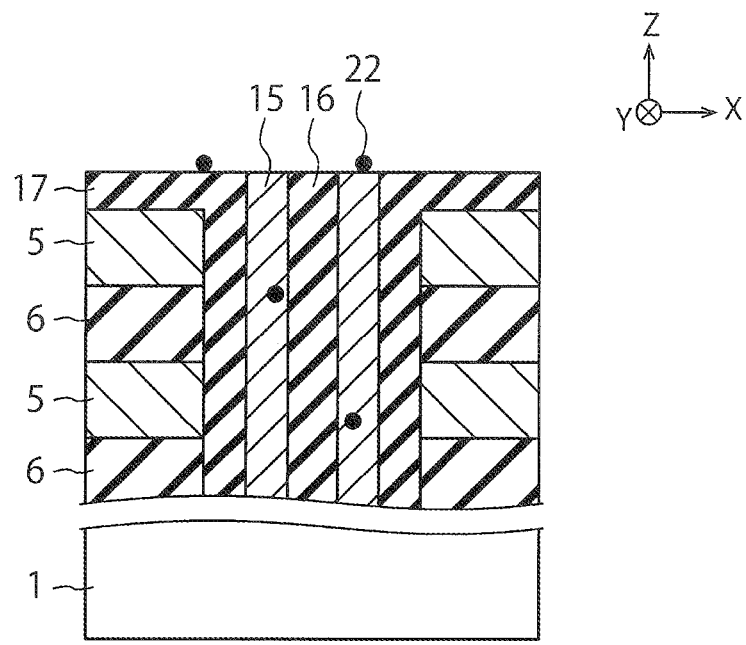

Next, the getter layer 33 on the memory film 17, the channel semiconductor layer 15 and the core insulator 16 is removed (FIG. 18A). The getter layer 33 may be removed with a liquid chemical such as an aqueous choline solution or may be removed with etching gas such as $Cl_2$ gas, HCl gas or HBr gas. Otherwise, the getter layer 33 may be removed by CMP or RIE.

Figure 18B:
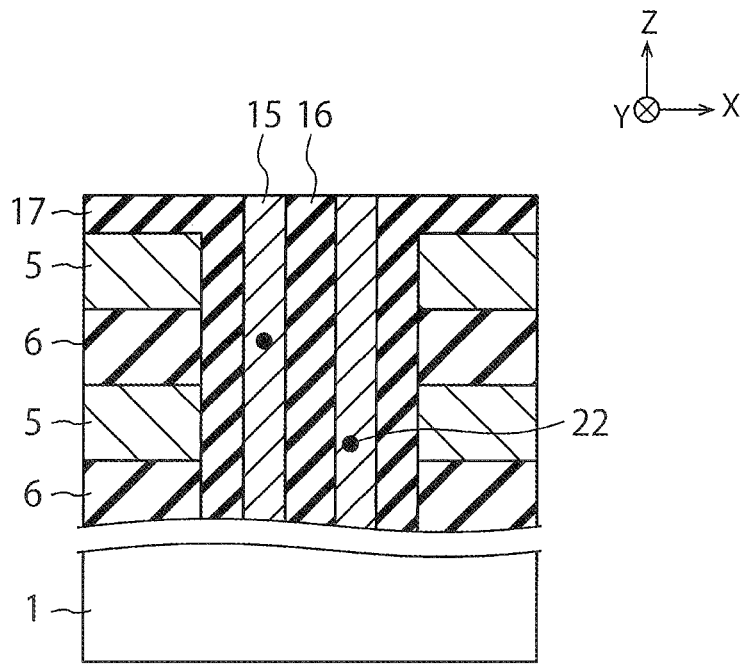

Next, the metal atoms 22 that remain on the upper surfaces of the memory film 17, the channel semiconductor layer 15 and the core insulator 16 are removed (FIG. 18B). In the present embodiment, these metal atoms 22 remain in a form of NiSi$_x$ by way of example, and are removed with a liquid chemical containing HF and $H_2O_2$ or a liquid chemical containing HF and $O_3$.

After that, the steps in FIGS. 17A to 18B may be performed by additional one or more cycles (note that the step in FIG. 17A is limited to the step of forming the getter layer 33). Thereby, the concentration of the metal atoms 22 in the channel semiconductor layer 15 can be further reduced. When the steps in FIGS. 17A to 18B are performed by a plurality of cycles, the concentration of the metal atoms 22 in the channel semiconductor layer 15 may reach $4.0 \times 10^{17}$ [atoms/cm$^3$] or less only after all these cycles complete.

After that, various interconnect layers, plug layers, inter layer dielectrics and the like are formed on the substrate 1. Moreover, the inter layer dielectric 31 is formed over the whole surface of the substrate 1, an opening part is formed in the inter layer dielectric 31, and the interconnect layer 32 is formed on the channel semiconductor layer 15 and the core insulator 16 in the opening part. As above, the semiconductor storage device in FIG. 9 is manufactured.

As above, the channel semiconductor layer 15 of the present embodiment is formed such that the grain diameters of the crystal grains in the channel semiconductor layer 15 are 80 nm or more and 1600 nm or less. Furthermore, the concentration of the metal atoms 22 in the channel semiconductor layer 15 of the present embodiment is adjusted to be $4.0 \times 10^{17}$ [atoms/cm$^3$] or less in the final stage. Therefore, similarly to the second embodiment, according to the present embodiment, characteristics of the channel semiconductor layer 15 can be improved, for example, the mobility in the channel semiconductor layer 15 being increased while the leak current at the tunnel insulator 14 being suppressed.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a stacked body in which a plurality of conducting layers are stacked through a plurality of insulating layers in a first direction;
   a semiconductor layer penetrating the stacked body, extending in the first direction and including metal atoms; and
   a memory film including a first insulator, a charge storage layer and a second insulator that are provided between the stacked body and the semiconductor layer,
   wherein
   a thickness of the semiconductor layer in a direction perpendicular to the first direction is 10 nm or less, and
   the semiconductor layer includes a crystal grain having a <100> orientation in the direction perpendicular to the first direction.

2. A semiconductor storage device comprising:
   a stacked body in which a plurality of conducting layers are stacked through a plurality of insulating layers in a first direction;
   a semiconductor layer penetrating the stacked body, extending in the first direction and including metal atoms; and
   a memory film including a first insulator, a charge storage layer and a second insulator that are provided between the stacked body and the semiconductor layer,
   wherein
   the semiconductor layer surrounds a third insulator penetrating the stacked body and extending in the first direction, and
   the semiconductor layer includes a first portion having a concentration of the metal atoms that is lower than a concentration of the metal atoms in a first region at an interface between the third insulator and the semiconductor layer, the first portion being spaced apart from the first region in a second direction, the second direction being perpendicular to the first direction.

3. The device of claim 1, wherein
   the semiconductor layer includes a region surrounded by one of the plurality of insulating layers and one of the plurality of conducting layers, and
   a grain boundary does not exist in the region or only a grain boundary between two crystal grains exists in the region.

4. The device of claim 2, wherein a thickness of the semiconductor layer in a direction perpendicular to the first direction is 15 nm or less.

5. The device of claim 2, wherein the semiconductor layer includes the crystal grain having a <100> orientation in a direction perpendicular to the first direction.

6. The device of claim 1, wherein a grain diameter of the crystal grain in the semiconductor layer is 80 nm or more and 1600 nm or less.

7. The device of claim 1, wherein a concentration of the metal atoms in the semiconductor layer is $4.0 \times 1017$ [atoms/cm3] or less.

8. The device of claim 1, wherein the metal atoms include atoms of at least any of Au (gold), Al (aluminum), Cu (copper), Ag (silver), Pd (palladium), Ni (nickel) and Pt (platinum).

9. The device of claim 1, wherein the metal atoms include atoms of at least any of Mn (manganese), Rh (rhodium), Co (cobalt), Fe (iron), Cr (chromium), Ti (titanium), Nb (niobium), Ir (iridium), Ta (tantalum), Re (rhenium), Mo (molybdenum), V (vanadium), Hf (hafnium), Ru (ruthenium), Zr (zirconium) and W (tungsten).

10. The device of claim 1, wherein the semiconductor layer includes boron atoms, phosphorus atoms or arsenic atoms in a concentration of $1.0 \times 10^{16}$ [atoms/cm3] or more and $1.0 \times 10^{19}$ [atoms/cm3] or less.

11. The device of claim 1, wherein a thickness of the first insulator in a direction perpendicular to the first direction is 5 nm or more and 10 nm or less.

12. The device of claim 1, further comprising an interconnect layer provided on an upper end of the semiconductor layer, and electrically connected to the semiconductor layer.

13. The device of claim 1, wherein
the semiconductor layer surrounds a third insulator penetrating the stacked body and extending in the first direction, and
at least one crystal grain in the semiconductor layer has a shape surrounding the third insulator.

14. The device of claim 2, wherein at least one crystal grain in the semiconductor layer has a shape surrounding the third insulator.

* * * * *